US012677508B2

(12) United States Patent
Hirama et al.

(10) Patent No.: US 12,677,508 B2
(45) Date of Patent: Jul. 7, 2026

(54) LIGHT-EMITTING ELEMENT AND METHOD FOR MANUFACTURING THE SAME

(71) Applicant: NTT, Inc., Tokyo (JP)

(72) Inventors: Kazuyuki Hirama, Tokyo (JP);
Yoshitaka Taniyasu, Tokyo (JP);
Kazuhide Kumakura, Tokyo (JP)

(73) Assignee: NTT, Inc., Tokyo (JP)

( * ) Notice: Subject to any disclaimer, the term of this patent is extended or adjusted under 35 U.S.C. 154(b) by 571 days.

(21) Appl. No.: 18/005,136

(22) PCT Filed: Jul. 13, 2020

(86) PCT No.: PCT/JP2020/027223
§ 371 (c)(1),
(2) Date: Jan. 11, 2023

(87) PCT Pub. No.: WO2022/013910
PCT Pub. Date: Jan. 20, 2022

(65) Prior Publication Data
US 2023/0261138 A1 Aug. 17, 2023

(51) Int. Cl.
*H10H 20/81* (2025.01)
*H10H 20/01* (2025.01)
*H10H 20/825* (2025.01)

(52) U.S. Cl.
CPC .... *H10H 20/825* (2025.01); *H10H 20/01335* (2025.01)

(58) Field of Classification Search
None
See application file for complete search history.

(56) References Cited

U.S. PATENT DOCUMENTS

| | | | |
|---|---|---|---|
| 2007/0114539 A1* | 5/2007 | Suzuki | H10H 20/81 257/E33.073 |
| 2013/0292687 A1 | 11/2013 | Jiang et al. | |
| 2014/0030836 A1* | 1/2014 | Murali | H01L 21/76254 257/E33.013 |

(Continued)

FOREIGN PATENT DOCUMENTS

| | | |
|---|---|---|
| JP | H03112177 A | 5/1991 |
| JP | 08125275 A | 5/1996 |

(Continued)

OTHER PUBLICATIONS

Jena et al. "The new nitrides: layered, ferroelectric, magnetic, metallic and superconducting hitrides to boost the GaN photonics and electronics eco-system," Japanese Journal of Applied Physics, vol. 58, May 17, 2019, 8 pages.

(Continued)

*Primary Examiner* — Bradley Smith
(74) *Attorney, Agent, or Firm* — Slater Matsil, LLP

(57) ABSTRACT

A light-emitting element includes: a light emitting layer formed of an i-type layered nitride semiconductor; a first semiconductor layer that is disposed on one surface of the light emitting layer, and is formed of a p-type layered nitride semiconductor or p-type diamond; and a second semiconductor layer that is disposed on the other surface of the light emitting layer, and is formed of an n-type layered nitride semiconductor.

10 Claims, 8 Drawing Sheets

(56)     References Cited

U.S. PATENT DOCUMENTS

2017/0098741 A1*   4/2017  Lee ..................... H10H 20/831

FOREIGN PATENT DOCUMENTS

JP          10145006  A     5/1998
JP          2007096130  A     4/2007

OTHER PUBLICATIONS

Kubota et al. "Deep Ultraviolet Light Emitting Hexagonal Boron Nitride Synthesized at Atmospheric Pressure," Science, vol. 317, Aug. 17, 2007, pp. 932-934.
Sachdev et al. "Investigation of the c-BN/h-BN phase transformation at normal pressure," Diamond and Related Materials, vol. 6, Mar. 1997, pp. 286-292.
Watanabe et al. "Far-ultraviolet plane-emission handheld device based on hexagonal boron nitride," Nature Photonics, Letters, Sep. 20, 2009, vol. 3, pp. 591-594. As discussed in the specification.

* cited by examiner

~102

~101

LIGHT-EMITTING ELEMENT AND METHOD FOR MANUFACTURING THE SAME

CROSS-REFERENCE TO RELATED APPLICATIONS

This application is a national phase entry of PCT Application No. PCT/JP2020/027223, filed on Jul. 13, 2020, which application is hereby incorporated herein by reference.

TECHNICAL FIELD

The present invention relates to a light-emitting element comprising layered materials and a method for manufacturing the light-emitting element.

BACKGROUND

According to studies with electron beam irradiation, layered hexagonal boron nitride (h-BN) having a layered structure of 2H reportedly exhibits a high external quantum efficiency in an ultraviolet region, and is expected to be applied to a light emitting device capable of sterilization and high-density information storage. Hexagonal boron nitride is a semiconductor material having a bandgap energy corresponding to an emission wavelength of about 215 nm, but it is also possible to control the emission wavelength with a mixed crystal of Al, Ga, and In, which are group-III elements other than boron.

A light emitting device that emits deep ultraviolet light using h-BN is now described with reference to FIG. 3 (see Non Patent Literature 1). First, this light emitting device includes a vacuum vessel 301, a glass plate 302 forming one surface of the vacuum vessel 301, and a light emitting layer 303 formed on the inner side of the vacuum vessel 301 of the glass plate 302. This light emitting device also includes a power supply 304 that applies an accelerating voltage to the light emitting layer 303, and an electron beam source 305 that irradiates the light emitting layer 303 with an electron beam 321.

The light emitting layer 303 is formed of undoped h-BN powder. The electron beam source 305 includes a field-emission electron gun 311, a constant-voltage circuit 312 that applies a voltage to the electron gun 311, a gate electrode 313 for field-emission of electrons from the electron gun 311, and a gate power supply 314 that applies a gate voltage to the gate electrode 313.

Electrons and holes are generated in the h-BN of the light emitting layer 303 by the high-energy electron beam 321 emitted from the electron beam source 305 onto the light emitting layer 303. As the holes and the electrons recombine, light 322 centered on a wavelength of 225 nm is generated from the light emitting layer 303. An emission wavelength derived from free excitons of h-BN is 215 nm, but emission at a wavelength of 225 nm is derived from a phonon replica of bound excitons or free excitons generated due to impurities or crystal defects, or the like.

CITATION LIST

Non Patent Literature

Non Patent Literature 1 Kenji Watanabe et al., "Far-ultraviolet plane-emission handheld device based on hexagonal boron nitride", Nature Photonics, vol. 3, pp. 591-594, 2009.

SUMMARY

Technical Problem

Meanwhile, in the conventional light emitting device described above, the emission intensity becomes higher when the energy of the electrons to be emitted and the amount of current are increased, but this requires an increase in the size of the electron beam source. Also, the electron beam source needs to have a vacuum structure, and the structure is complicated. Therefore, it is difficult to manufacture a small-sized ultraviolet light emitting device.

On the other hand, as the size of the device structure is made smaller, increasing the energy of the electrons to be emitted and the amount of current becomes more difficult, and a high emission intensity will not be obtained. In a conventional device having a size of 6.5 cm×3.5 cm, under the operating conditions that the accelerating voltage was 9 kV and the anode current was 100 µA, the emission intensity was 1 mW, and the external quantum efficiency remained at about 0.6%.

Embodiments of the present invention have been made to solve the above problems, and aims to obtain a high emission intensity with a small-sized element using layered BNs or a mixed crystal layer thereof.

Solution to Problem

A light-emitting element according to embodiments of the present invention includes: a light emitting layer formed of an i-type layered nitride semiconductor; a first semiconductor layer formed of a p-type layered nitride semiconductor or p-type diamond, the first semiconductor layer disposed on one surface of the light emitting layer; and a second semiconductor layer formed of an n-type layered nitride semiconductor, the second semiconductor layer disposed on the other surface of the light emitting layer.

A light-emitting element manufacturing method according to embodiments of the present invention is a light-emitting element manufacturing method for manufacturing the light-emitting element described above, and includes the steps of: forming the light emitting layer; forming the first semiconductor layer; and forming the second semiconductor layer. Each layered nitride semiconductor is formed through structural phase transition from a zinc blende structure to a layered structure.

Advantageous Effects of Embodiments of the Invention

As described above, according to embodiments of the present invention, a high emission intensity can be obtained with a small-sized element using layered BNs or a mixed crystal layer thereof.

DETAILED DESCRIPTION OF ILLUSTRATIVE EMBODIMENTS

The following is a description of a method for manufacturing a light-emitting element according to an embodiment of the present invention, with reference to FIGS. 1A to 1F.

Figure 1A:
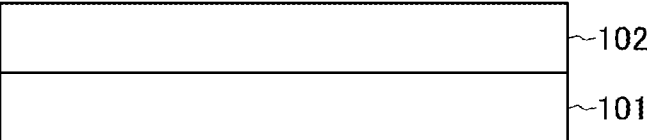
FIG. 1A is a cross-sectional view illustrating a state of a light-emitting element in an intermediate step for explaining a method for manufacturing a light-emitting element according to an embodiment of the present invention.

First, as illustrated in FIG. 1A, a first semiconductor layer 102 is formed on a substrate 101. The substrate 101 is formed of diamond that is highly doped with B to be of p-type and has a (111)-plane as its principal surface, for example. The substrate 101 can be formed of one of c-BN, 3C-SiC, 4H-SiC, 6H-SiC, and Si. Note that the principal surface of a substrate formed of c-BN, 3C-SiC, or Si is a (111)-plane, while the principal surface of a substrate formed of 4H-SiC or 6H-SiC is a (0001)-plane.

The first semiconductor layer 102 is formed of a nitride semiconductor having a p-type zinc blende structure. For example, the first semiconductor layer 102 is formed of c-BN having a zinc blende structure doped with Mg as an acceptor. The acceptor concentration in the first semiconductor layer 102 is $1 \times 10^{18}$ cm$^{-3}$, and the hole concentration at this stage is $1 \times 10^{16}$ cm$^{-3}$. Also, the first semiconductor layer 102 is designed to have a thickness of about 200 nm. For example, it is possible to form the first semiconductor layer 102 by growing cubic boron nitride (c-BN) having a zinc blende structure on the substrate 101 by a well-known ion-beam-assisted MBE method. The first semiconductor layer 102 grown on the substrate 101 whose principal surface is a (111)-plane has a (111)-plane as its principal surface.

Note that, in the nitride semiconductor that forms the first semiconductor layer 102, the group-III element can be composed of B, or at least one of Al, Ga, and In in addition to B. The nitride semiconductor that forms the first semiconductor layer 102 can be of p-type, using any one of Mg, Be, C, Zn, and Ca as an acceptor.

Also, the first semiconductor layer 102 can be formed of p-type diamond. It is possible to make diamond p-type by doping the diamond with B as an acceptor. For example, it is possible to form the first semiconductor layer 102 by growing p-type diamond on the substrate 101 by a known plasma CVD method. In this case, the acceptor concentration of B in the first semiconductor layer 102 is $1 \times 10^{19}$ cm$^{-3}$, and the hole concentration is $1 \times 10^{16}$ cm$^{-3}$. The first semiconductor layer 102 formed of p-type diamond is designed to have a thickness of 200 nm.

Figure 1B:
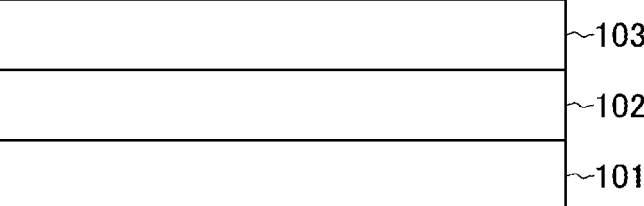
FIG. 1B is a cross-sectional view illustrating a state of a light-emitting element in an intermediate step for explaining a method for manufacturing a light-emitting element according to an embodiment of the present invention.

Next, as illustrated in FIG. 1B, an i-type light-emitting-layer forming layer 103 is formed on the first semiconductor layer 102. The light-emitting-layer forming layer 103 is formed of a nitride semiconductor having an undoped zinc blende structure. For example, the first semiconductor layer 102 is undoped (i-type), and is formed of c-BN having a zinc blende structure. For example, it is possible to form the light-emitting-layer forming layer 103 by growing cubic boron nitride (c-BN) having a zinc blende structure on the first semiconductor layer 102 by a well-known ion-beam-assisted MBE method. The light-emitting-layer forming layer 103 is designed to have a thickness of 1000 nm. The light-emitting-layer forming layer 103 grown on the first semiconductor layer 102 whose principal surface is a (111)-plane has a (111)-plane as its principal surface.

Figure 1C:
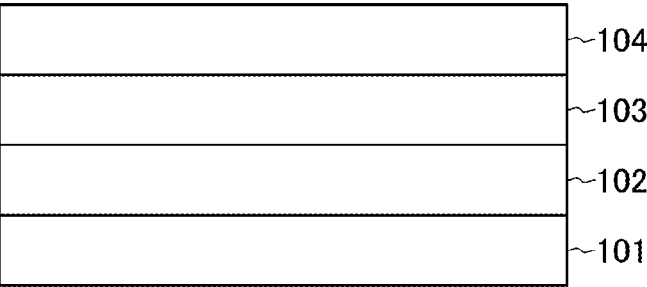
FIG. 1C is a cross-sectional view illustrating a state of a light-emitting element in an intermediate step for explaining a method for manufacturing a light-emitting element according to an embodiment of the present invention.

Next, as illustrated in FIG. 1C, a second semiconductor layer 104 is formed on the light-emitting-layer forming layer 103. The second semiconductor layer 104 is formed of a nitride semiconductor having a p-type zinc blende structure. For example, the second semiconductor layer 104 is formed of c-BN including a zinc blende structure doped with Si as a donor. The donor concentration in the second semiconductor layer 104 is $1 \times 10^{18}$ cm$^{-3}$, and the electron concentration at this stage is $1 \times 10^{16}$ cm$^{-3}$. Also, the second semiconductor layer 104 is designed to have a thickness of about 200 nm. For example, it is possible to form the second semiconductor layer 104 by growing cubic boron nitride (c-BN) having a zinc blende structure on the light-emitting-layer forming layer 103 by a well-known ion-beam-assisted MBE method. The second semiconductor layer 104 grown on the light-emitting-layer forming layer 103 whose principal surface is a (111)-plane has a (111)-plane as its principal surface.

Note that, in the nitride semiconductor that forms the second semiconductor layer 104, the group-III element can be composed of B, or at least one of Al, Ga, and In in addition to B. Further, the nitride semiconductor that forms the second semiconductor layer 104 can be made n-type, using any one of Si, O, S, and Se as the donor.

Note that the bandgap energy of h-BN of p-type, n-type, and i-type is 6.2 eV.

Figure 1D:
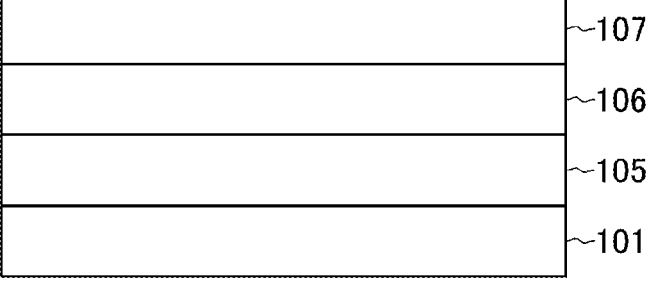
FIG. 1D is a cross-sectional view illustrating a state of a light-emitting element in an intermediate step for explaining a method for manufacturing a light-emitting element according to an embodiment of the present invention.

Next, each of the first semiconductor layer 102, the light-emitting-layer forming layer 103, and the second semiconductor layer 104 is subjected to structural phase transition from a zinc blende structure to a layered structure, so that a first semiconductor layer 105 formed of a p-type layered nitride semiconductor or p-type diamond, a light emitting layer 106 formed of an i-type layered nitride semiconductor, and a second semiconductor layer 107 formed of an n-type layered nitride semiconductor are stacked in this order on the substrate 101, as illustrated in FIG. 1D.

For example, layered structural phase transition can be performed at a temperature of 1200° C. or higher in an atmosphere at a pressure of 1013250 Pa or lower. For example, structural phase transition can be performed by a heating treatment under the conditions that the nitrogen atmosphere is at a pressure of 79993.2 Pa, the heating temperature is 1500° C., and the heating time is five hours. By this treatment, c-BN (a nitride semiconductor) having a zinc blende structure that forms each layer undergoes structural phase transition to h-BN, which is a layered nitride semiconductor. Here, h-BN exhibits the same acceptor concentration, hole concentration, donor concentration, and electron concentration as those of c-BN. Also, the layered nitride semiconductor has a layered structure of 2H or 3R.

Further, it is possible to perform structural phase transition from a zinc blende structure to a layered structure by setting the temperature at 100° C. or higher in an atmosphere at a pressure of 101325 Pa or lower, and performing plasma irradiation with at least one kind of gas among nitrogen, argon, and hydrogen.

For example, the structural phase transition was performed by hydrogen plasma irradiation. Hydrogen plasma is generated with microwaves under the condition that the pressure is set at 3333.05 Pa, and the generated hydrogen plasma is applied to a nitride semiconductor having a zinc blende structure under the condition that the heating temperature is set at 500° C. The irradiation time is five hours. By this treatment, c-BN (a nitride semiconductor) having a zinc blende structure that forms each layer undergoes structural phase transition to h-BN, which is a layered nitride semiconductor. In this case, h-BN also exhibits the same acceptor concentration, hole concentration, donor concentration, and electron concentration as those of c-BN. Also, the layered nitride semiconductor has a layered structure of 2H or 3R.

Figure 1E:
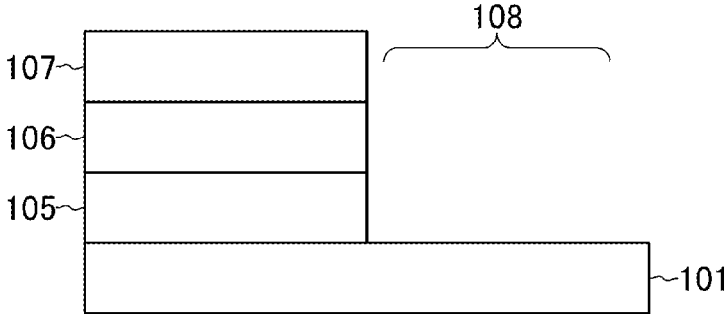
FIG. 1E is a cross-sectional view illustrating a state of a light-emitting element in an intermediate step for explaining a method for manufacturing a light-emitting element according to an embodiment of the present invention.

Next, the layered structure of the first semiconductor layer 105, the light emitting layer 106, and the second semiconductor layer 107 is patterned and is processed into a mesa shape by selective etching using a mask pattern formed by a known lithography technique, and a region 108 where a surface of the substrate 101 is exposed is formed in part of the substrate 101 as illustrated in FIG. 1E. The etching described above can be performed through a plasma etching process using chlorine ($Cl_2$) and a boron trichloride gas ($BCl_3$) as etching gases, for example.

Figure 1F:
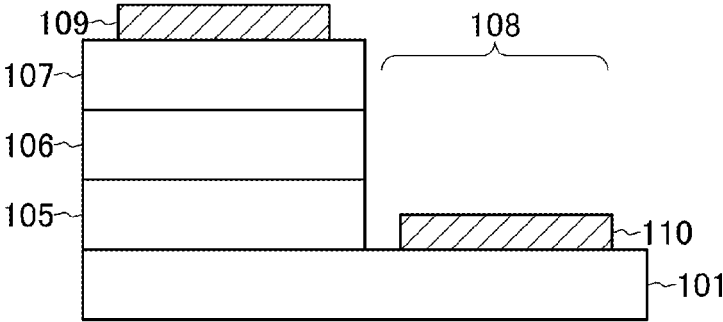
FIG. 1F is a cross-sectional view illustrating a state of a light-emitting element in an intermediate step for explaining a method for manufacturing a light-emitting element according to an embodiment of the present invention.

Next, as illustrated in FIG. 1F, a first electrode 109 is formed on the second semiconductor layer 107, and a second electrode no is formed in the region 108 of the substrate 101. The first electrode 109 is in ohmic contact with the second semiconductor layer 107, and the second electrode no is in ohmic contact with the substrate 101. The first electrode 109 and the second electrode no have a layered structure of Ti/Pt/Au. For example, each metal material is deposited by electron beam deposition, and is then subjected to a heating treatment in a nitrogen atmosphere at 750° C. for 10 minutes, so that the ohmic contact mentioned above is obtained.

The light-emitting element according to the embodiment described above includes: the light emitting layer 106 formed of an i-type layered nitride semiconductor; the first semiconductor layer 105 that is disposed on one surface of the light emitting layer 106, and is formed of a p-type layered nitride semiconductor or p-type diamond; and the second semiconductor layer 107 that is disposed on the other surface of the light emitting layer 106, and is formed of an n-type layered nitride semiconductor. This light-emitting element is a light-emitting element that achieves light emission by applying electrical current to the light emitting layer 106, using the first semiconductor layer 105 and the second semiconductor layer 107 as a current injection structure.

In the light-emitting element according to the embodiment described above, ultraviolet light emission centered on a wavelength of 215 nm derived from emission recombination of free excitons of h-BN was obtained from the light emitting layer 106 through current injection, which differs from a conventional boron nitride light-emitting element in which light emission centered on a wavelength of 225 nm derived from a phonon replica of bound excitons or free excitons is dominant. In a light-emitting element in which a mesa including a layered structure of the first semiconductor layer 105, the light emitting layer 106, and the second semiconductor layer 107 has a dimension of 3 m×3 mm in a plan view, the external quantum efficiency was about 10% in a case where the first semiconductor layer 105 was h-BN, and the external quantum efficiency was about 6% in a case where the first semiconductor layer 105 was diamond.

As described above, according to the embodiment, in a case where the first semiconductor layer 105 was h-BN, an external quantum efficiency 15 times or more higher was exhibited with a small element size of about ½₅₀, compared with a conventional boron nitride light-emitting element. Also, in a case where the first semiconductor layer 105 was diamond, the external quantum efficiency was about 10 times higher with a small element size of about ½₅₀, compared with a conventional boron nitride light-emitting element.

Figure 2:
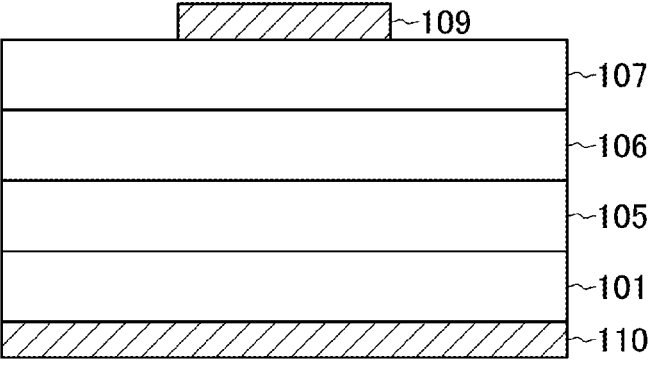
FIG. 2 is a configuration diagram illustrating the configuration of a light-emitting element according to an embodiment of the present invention.
Figure 3:
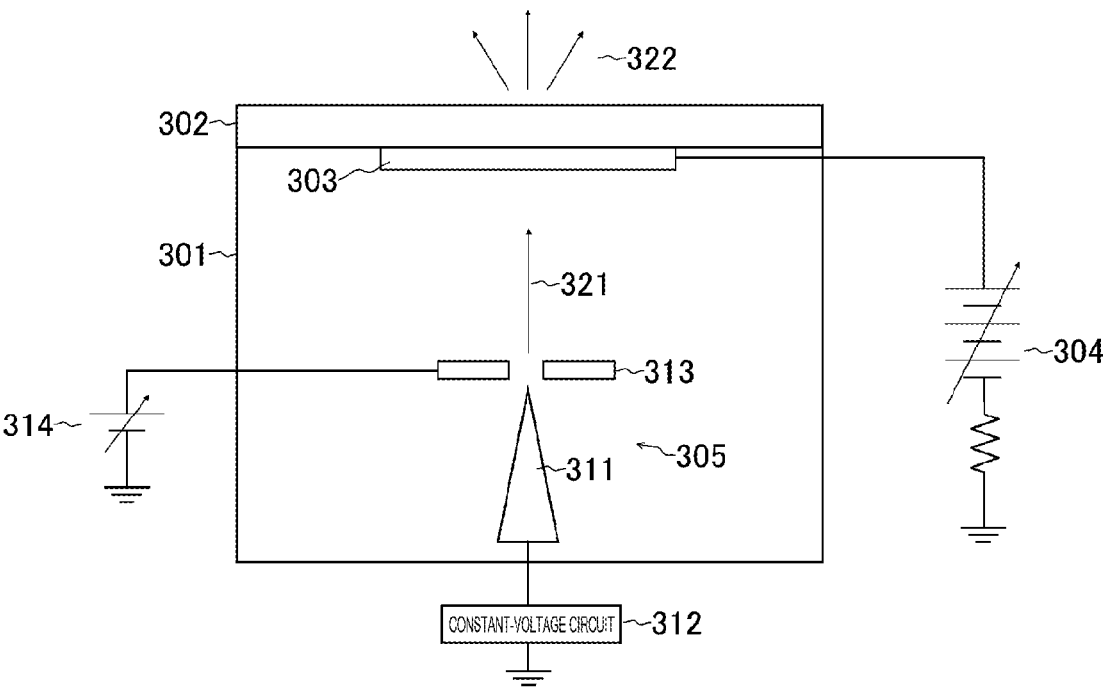
FIG. 3 is a configuration diagram illustrating the configuration of a light emitting device.

Note that, in the above description, a mesa structure is created on the substrate 101 to form the region 108, and the second electrode no is formed on the substrate 101 in the region 108. However, the present invention is not limited to this example. For example, as illustrated in FIG. 2, the second electrode no can be formed on the back surface of the substrate 101, without a mesa structure formed as described above. In the light-emitting element having this structure, a high external quantum efficiency was also obtained in the same manner as above.

Note that, in the example case described above, the acceptor concentration and the donor concentration in the nitride semiconductor are $1\times10^{18}$ $cm^{-3}$. However, in the range of $1\times10^{16}$ to $1\times10^{22}$ $cm^{-3}$, a higher external quantum efficiency was obtained when the acceptor concentration and the donor concentration were higher. In a case where the acceptor concentration in the first semiconductor layer 105 was $1\times10^{17}$ $cm^{-3}$ or higher, and the donor concentration in the second semiconductor layer 107 was $1\times10^{16}$ $cm^{-3}$ or higher, an external quantum efficiency higher than that of a boron nitride light-emitting element having a conventional structure was obtained.

Also, in the example case described above, the acceptor concentration in diamond is $1\times10^{19}$ $cm^{-3}$. However, in the range of $1\times10^{16}$ to $1\times10^{22}$ $cm^{-3}$, a higher external quantum efficiency was obtained when the acceptor concentration was higher. In a case where the acceptor concentration in the first semiconductor layer formed of p-type diamond was $1\times10^{17}$ $cm^{-3}$ or higher, and the donor concentration in the n-type second semiconductor layer was $1\times10^{16}$ $cm^{-3}$ or higher, an external quantum efficiency higher than that of a boron nitride light-emitting element having a conventional structure was obtained.

Also, in the example case described above, the hole concentration and the electron concentration were $1\times10^{16}$ $cm^{-3}$. However, in the range of $1\times10^{14}$ to $1\times10^{20}$ $cm^{-3}$, a higher external quantum efficiency was obtained when the hole concentration and the electron concentration were higher. In a case where the hole concentration in the first semiconductor layer was $1\times10^{16}$ $cm^{-3}$ or higher, and the electron concentration in the second semiconductor layer was $1\times10^{15}$ $cm^{-3}$ or higher, an external quantum efficiency higher than that of a boron nitride light-emitting element having a conventional structure was obtained.

In the case described above, the substrate is formed of p-type diamond highly doped with B. However, similar results were obtained also in a case where the substrate was formed of p-type c-BN, p-type 3C-SiC, p-type 4H-SiC, p-type 6H-SiC, or p-type Si. Note that, in a case where the plane orientations of the principal surfaces of the respective nitride semiconductor layers were (001), (110), and (113), the external quantum efficiency became lower in the obtained light-emitting element, compared with a case in which the plane orientation was (111). Note that, in a case where the substrate material was diamond, c-BN, 3C-SiC, or Si, and the plane orientations thereof were (001), (110), and (113), the external quantum efficiency became lower compared with the case of (111). Further, in a case where the substrate material was 4H-SiC or 6H-SiC, and the plane orientations thereof were (11-20), (1-100), and (1-102), the external quantum efficiency became lower compared with a case where the plane orientations were (0001) and (000-1).

Note that, although an example in which h-BN is adopted as a layered nitride semiconductor layer has been described herein, a BAlGaInN mixed crystal, a BAlN mixed crystal, a BGaN mixed crystal, a BInN mixed crystal, a BAlGaN mixed crystal, a BARN mixed crystal, or a BGaInN mixed crystal having a 2H or 3R stack cycle can be used as a layered nitride semiconductor layer. In the case of these materials, similar results were obtained in a case where the bandgap energy of the i-type light emitting layer was equal to or smaller than the bandgap energy of the layered nitride semiconductor of p-type or n-type. Also, in a case where the first semiconductor layer was formed of p-type diamond, similar results were achieved when the bandgap energy of the light emitting layer was equal to or smaller than the bandgap energy of the n-type layered nitride semiconductor, regardless of the bandgap energy magnitude relationship between the light emitting layer and the first semiconductor layer. Note that the emission wavelength changed with the composition of the group-III element.

Further, in the example case described above, Mg was used as the acceptor, and Si was used as the donor. However, similar results were achieved also in a case where Be, C, Zn, or Ca was used as the acceptor, and Si, O, S, or Se was used as the donor.

Also, in the example case described above, the thickness of the first semiconductor layer and the second semiconductor layer is 200 nm. However, in a case where the thickness was 10 nm or greater, similar results were achieved. Although the thickness of the light emitting layer is 1000 nm in the above description, similar results were achieved when the thickness was 2 nm or greater. Also, an ion-beam-assisted MBE method has been described as an example of a method for growing c-BN, but similar results can be obtained when the method for growing c-BN is a plasma CVD method or a sputtering method.

Further, an example in which a nitrogen atmosphere at a pressure of 79993.2 Pa is used, and the heating temperature is set at 1500° C. has been described as a structural phase transition method. However, structural phase transition can be performed in the same manner as above, as long as the heating is performed at a high temperature of 1200° C. or higher in an atmosphere that is not necessarily a nitrogen atmosphere but may be an inert gas such as Ar or $H_2$ and in vacuum at any pressure. In a case where the pressure was higher than 980665 Pa, disordered-layer turbostratic boron nitride (t-BN) or a mixed layer of t-BN and c-BN was formed, and a nitride semiconductor layer having a 2H or 3R stack cycle was not obtained. Also, in a case where the heating temperature was lower than 1200° C., no structural phase transition occurred.

Further, in a case where structural phase transition was conducted through plasma irradiation, similar results were achieved through plasma irradiation that did not necessarily involve hydrogen plasma but involved nitrogen or argon, and plasma irradiation with a mixed gas of two or more elements among hydrogen, nitrogen, and argon. Also, the plasma irradiation was performed under the conditions that the pressure was 3333.05 Pa and the heating temperature was 500° C. However, when the pressure was 98066.5 Pa or lower, and the heating temperature was 100° C. or higher, similar effects were achieved. In a case where the pressure was higher than 98066.5 Pa, plasma irradiation could not be performed because plasma was not stably ignited, and structural phase transition did not occur when the heating temperature was lower than 100° C.

As described above, according to embodiments of the present invention, through structural phase transition from a zinc blende structure to a layered structure, a current injection structure is formed of a light emitting layer formed of an i-type layered nitride semiconductor, a first semiconductor layer formed of a p-type layered nitride semiconductor or p-type diamond, and a second semiconductor layer formed of an n-type layered nitride semiconductor. Thus, a high emission intensity can be obtained with a small-sized element using layered BNs or a mixed crystal layer thereof.

Note that it is obvious that the present invention is not limited to the embodiment described above, but can be modified and combined in many ways by a person having ordinary knowledge in the art within the technical idea of the present invention.

REFERENCE SIGNS LIST

101 Substrate
102 First semiconductor layer
103 Light-emitting-layer forming layer
104 Second semiconductor layer
105 First semiconductor layer
106 Light emitting layer
107 Second semiconductor layer
108 Region
109 First electrode
110 Second electrode.

The invention claimed is:

1. A light-emitting element comprising:
a first semiconductor layer including a p-type diamond;
a second semiconductor layer including a first layered nitride semiconductor formed of an n-type nitride semiconductor; and
a light emitting layer including a second layered nitride semiconductor formed of an i-type nitride semiconductor, wherein the first semiconductor layer is disposed on a first surface of the light emitting layer, and the second semiconductor layer is disposed on a second surface of the light emitting layer, and wherein:
the first layered nitride semiconductor and the second layered nitride semiconductor each include B; and
the first layered nitride semiconductor and the second layered nitride semiconductor each has a crystal structure of a 2H or 3R stack cycle.

2. The light-emitting element according to claim 1, wherein:
the first layered nitride semiconductor and the second layered nitride semiconductor each further include Al, Ga, or In.

3. The light-emitting element according to claim 1, wherein:
the first layered nitride semiconductor includes Si, O, S, or Se as a donor.

4. The light-emitting element according to claim 1, wherein:

a bandgap energy of the light emitting layer is equal to or smaller than a bandgap energy of the first semiconductor layer and a bandgap energy of the second semiconductor layer.

5. The light-emitting element according to claim 1, further comprising a substrate formed of diamond, c-BN, 3C-SiC, 4H-SiC, 6H-SiC, or Si, wherein the first semiconductor layer is disposed on the substrate.

6. A light-emitting element manufacturing method for manufacturing a light-emitting element, the method comprising:

forming a first semiconductor layer including a p-type diamond;

forming a second semiconductor layer including a first layered nitride semiconductor formed of an n-type nitride semiconductor; and forming a light emitting layer including a second layered nitride semiconductor formed of an i-type nitride semiconductor, wherein the first semiconductor layer is formed on a first surface of the light emitting layer, and the second semiconductor layer is formed on a second surface of the light emitting layer, wherein each of the first layered nitride semiconductor and the second layered nitride semiconductor is formed through structural phase transition from a zinc blende structure to a layered structure, wherein:

the first layered nitride semiconductor and the second layered nitride semiconductor each include B; and the first layered nitride semiconductor and the second layered nitride semiconductor each has a crystal structure of a 2H or 3R stack cycle.

7. The light-emitting element manufacturing method according to claim 6, wherein:

forming the first layered nitride semiconductor, and the second layered nitride semiconductor by the structural phase transition from the zinc blende structure to the layered structure is performed by raising a temperature to 1200° C. or higher.

8. The light-emitting element manufacturing method according to claim 7, wherein:

forming the first layered nitride semiconductor and the second layered nitride semiconductor by the structural phase transition from the zinc blende structure to the layered structure is performed by heating in an atmosphere at a pressure of 1013250 Pa or lower.

9. The light-emitting element manufacturing method according to claim 8, wherein:

forming the first layered nitride semiconductor and the second layered nitride semiconductor by the structural phase transition from the zinc blende structure to the layered structure is performed by performing plasma irradiation with a gas comprising nitrogen, argon, or hydrogen, raising a temperature to 100° C. or higher and heating in an atmosphere at a pressure of 101325 Pa or lower.

10. The light-emitting element manufacturing method according to claim 9 wherein:

forming the first layered nitride semiconductor and the second layered nitride semiconductor by the structural phase transition from the zinc blende structure to the layered structure is performed by performing plasma irradiation with a gas comprising nitrogen, argon, or hydrogen.

* * * * *